United States Patent [19]
Kushima

[11] Patent Number: 6,166,445
[45] Date of Patent: Dec. 26, 2000

[54] SEMICONDUCTOR DEVICE AND METHOD FOR PRODUCING SAME

[75] Inventor: Masahito Kushima, Tokyo, Japan

[73] Assignee: NEC Corporation, Tokyo, Japan

[21] Appl. No.: 09/019,745

[22] Filed: Feb. 6, 1998

[30] Foreign Application Priority Data

Feb. 7, 1997  [JP]  Japan ................................. 9-024990

[51] Int. Cl.[7] .............................. H01L 23/48; H01L 23/52
[52] U.S. Cl. ........................ 257/783; 257/782; 257/785
[58] Field of Search .................................. 257/782, 783, 257/727, 785, 626

[56] References Cited

U.S. PATENT DOCUMENTS 4,104,676  8/1978  Bednorz et al. .
5,001,542  3/1991  Tsukagoshi et al. .
5,027,189  6/1991  Shannon et al. .
5,146,308  9/1992  Chance et al. .

FOREIGN PATENT DOCUMENTS 3-82145  4/1991  Japan .

*Primary Examiner*—Sheila V. Clark
*Attorney, Agent, or Firm*—Sughrue, Mion, Zinn, Macpeak & Seas, PLLC

[57] ABSTRACT

A void-collection section is provided on a GaAs FET chip at a location that avoids a heat-generating region of the chip. Pressure is applied to the rear surface of the substrate corresponding to the heat-generating region of the chip, this causing the removal of a void from immediately under the heat-generating section, and the capture of the void by the void-collection section, thereby suppressing the localized rise in temperature of the chip caused by the existence of the void.

6 Claims, 4 Drawing Sheets

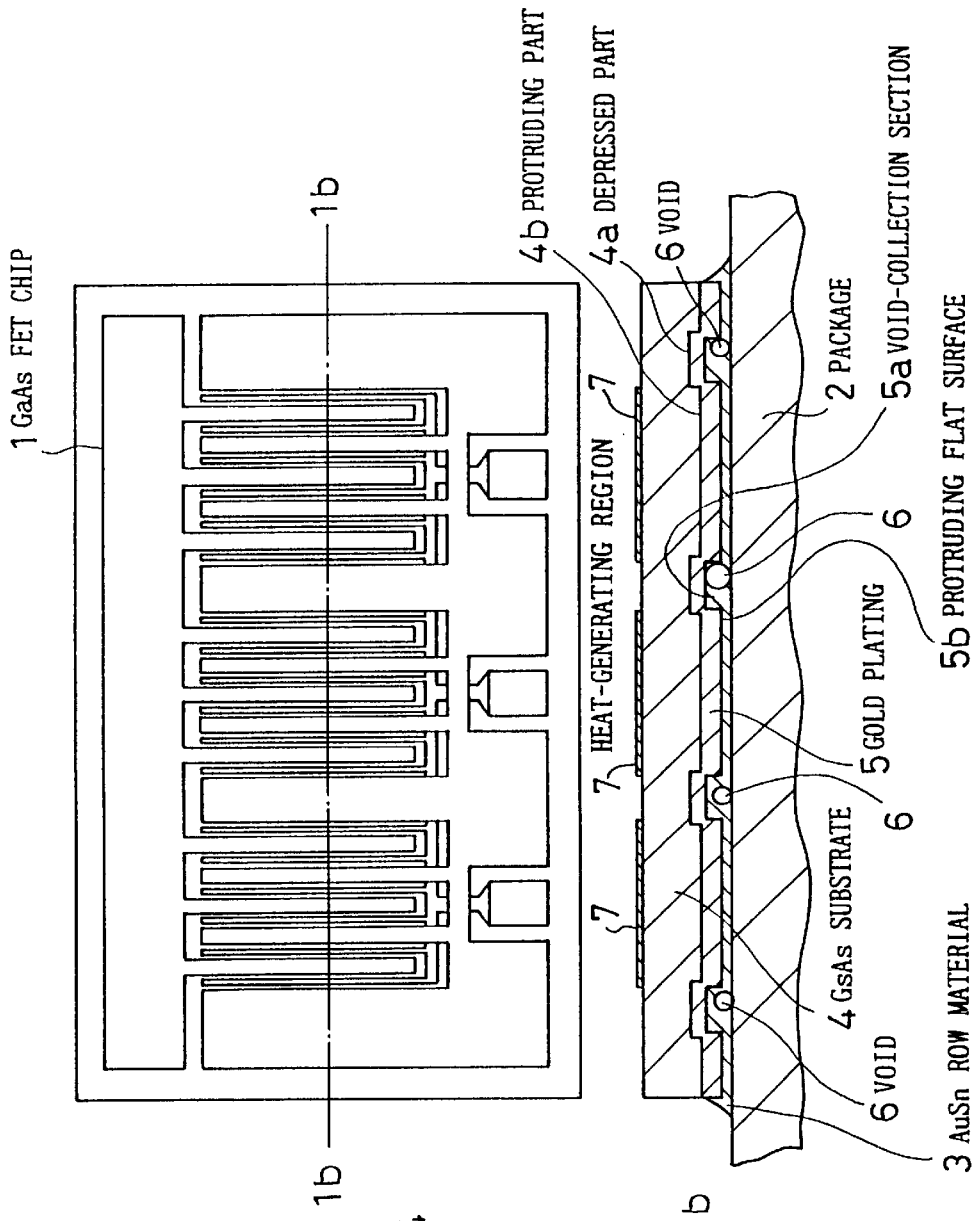
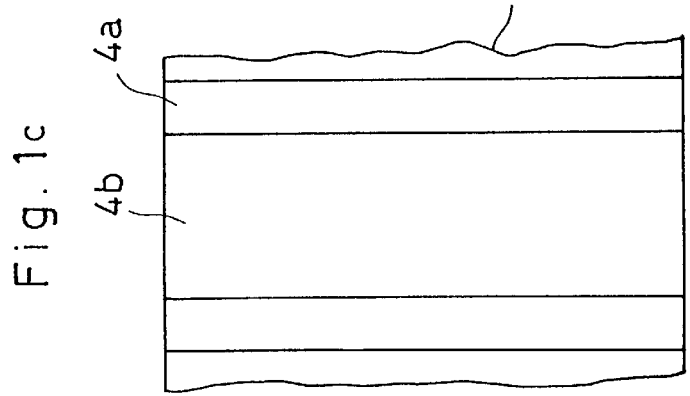

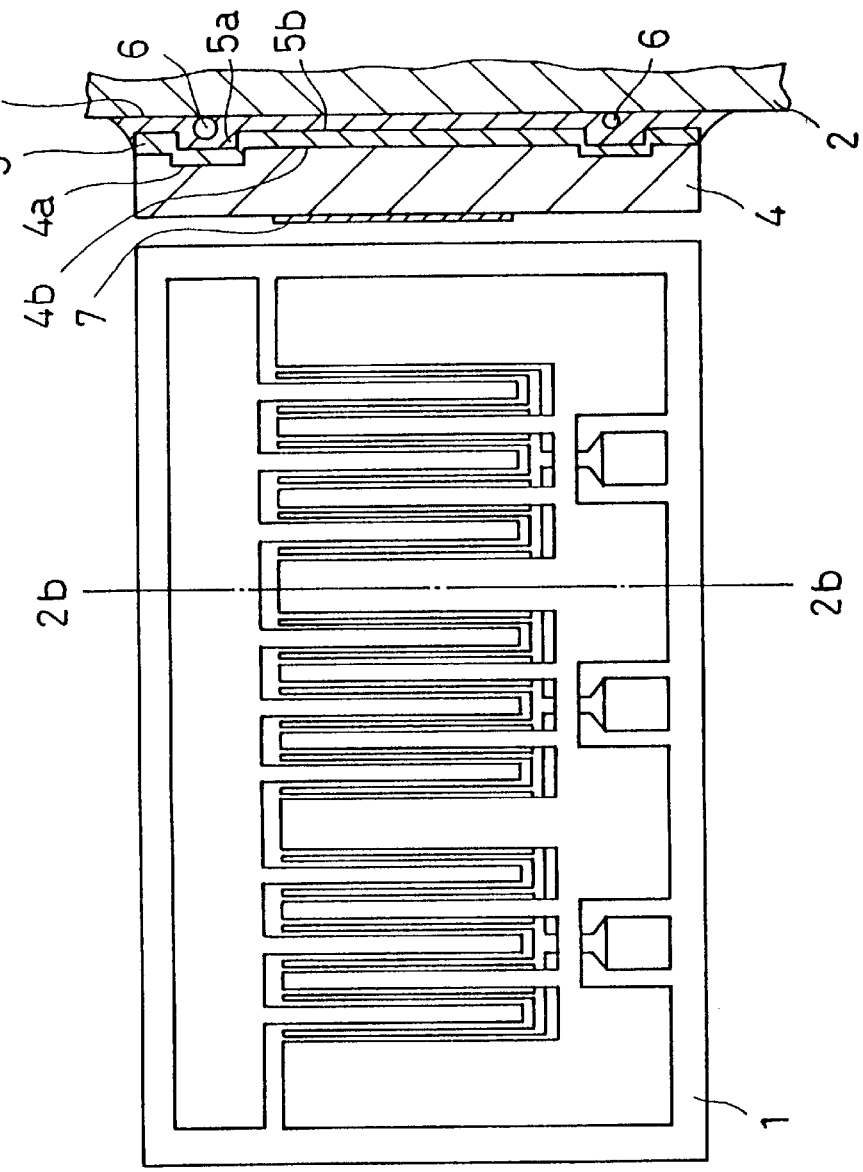

SEMICONDUCTOR DEVICE AND METHOD FOR PRODUCING SAME

BACKGROUND OF THE INVENTION

1. Field of the Invention

The present invention relates to a semiconductor device which generates heat when it operates.

2. Description of Related Art

To enable a semiconductor device such as GaAs power FET chips to obtain a large output, the gate width thereof is widened, this being accompanied by an increase in the chip size as well as an increase in the amount of heat that is generated when the device operates, making it necessary to efficiently release this heat during operation.

Because of this need, in the past, as shown with regard to a GaAs power FET chip 1 in FIG. 4, the thickness of the GaAs substrate 4 of the GaAs chip 1 is made small, a gold plating 5 is applied to the rear surface of the GaAs substrate 4, and an AuSn row material 3 that is applied to this gold plating 5 is used to mount the GaAs FET chip into a package 2. By adopting the construction that is shown in FIG. 4, it is possible to achieve good heat release and a reduction in the thermal resistance.

However, with the construction which is shown in FIG. 4, because the surface area of the linkage between the chip 1 and the package 2 is large, there is a tendency for a large number of voids 6 to occur in the AuSn row material 3.

In FIG. 4, in the case in which the locations at which the voids 6 occur are collected at heat-generating regions 7, the existence of the voids 6 worsens the release of heat from the chip 1, this causing a local rise in temperature at the location of the voids 6 that is greater than other regions, the subsequently leading to a deterioration in the chip characteristics and a decrease in the resistance of the chip to damage.

For this reason, in the Japanese Unexamined Patent Publication No.H3-82145, there is a disclosure of technology for suppressing the occurrence of voids. The technology disclosed in the above-noted Japanese Unexamined Patent Publication No.H3-82145 is that in which there is the problem that, although it might be possible that the voids could be broken up into finer parts, it is not possible to prevent the occurrence of a void within the solder layer that is applied immediately under the heat-generating region of the chip surface, so that it is not possible to improve the dispersion of heat from the chip.

In view of the above-noted problem, an object of the present invention is to provide a semiconductor device which prevents the occurrence of voids immediately under the heat-generating region of a chip.

SUMMARY OF THE INVENTION

To achieve the above-noted object, a semiconductor device according to the present invention comprises a package on which a semiconductor chip including a semiconductor substrate provided with operation circuits, is mounted, wherein said semiconductor chip is connected to said package via adhesive material attached to a back surface of said semiconductor chip, and further wherein at least one void collection section is provided at least on one of surfaces selected from a surface of said semiconductor chip opposite to said package and a surface of said package opposite to said semiconductor chip, and said void collection section comprising a concave portion and being provided at an area which avoids a heat-generating region on the contacting surface of said semiconductor chip, and when said semiconductor chip is contacted to said package with a pressure, said void collection section capturing voids that are removed from said adhesive material between said package and said chip located and existing in said heat-generating region on the contacting surface of said semiconductor chip.

Further in the present invention, a semiconductor device has a chip and a void-collection section, the chip having an element that generates heat when it operates, the rear surface of which is joined to a package by means of an adhesive material, and the void-collection section being a concave portion provided at position therein that avoids the heat-generating region of the chip, so that when downward pressure is applied to the chip, a void that is ejected from the adhesive material between the package and the heat-generating region of the chip is captured in a region that avoids the heat-generating region of the chip.

The rear surface that is opposite the heat-generating region of the above-noted chip has a protruding part, the surface of this protruding part being formed as a flat part that protrudes outward from the rear surface of the chip, so that it pushing a void that exists in the heat-generating region of the chip and which is caught in the space between it and the package away and outside of that region.

The void-collection section is provided so as to avoid the heat-generating region of the chip but in a location which is neighboring to a heat-generating region.

A void-collecting section is provided at a position that avoids a heat-generating region of the chip, the chip is pressed down onto the package so that the void is pushed away to a region outside of the heat-generating region of the chip, this void being captured in the void-collection section.

For this reason, the void is moved to a location outside the heat-generating region of the chip, enabling the prevention of the exposure thereof to a local high-temperature caused by the heat of the chip's heat-generating region.

DESCRIPTION OF DRAWING

FIG. 1(*a*) is a plan view which shows the first embodiment of the present invention, and FIG. 1(*b*) is a cross-sectional view thereof, along line A—A shown in FIG. 1(*a*), and FIG. 1(*c*) is a plan view of rear surface of the substrate.

FIG. 2(*a*) is a plan view which shows the second embodiment of the present invention, and FIG. 2 (*b*) is a cross-sectional view thereof, along line B—B shown in FIG. 2(*a*), and FIG. 2(*c*) is a plan view of rear surface of the substrate.

DETAILED DESCRIPTION OF THE PREFERRED EMBODIMENTS

Figure 3:
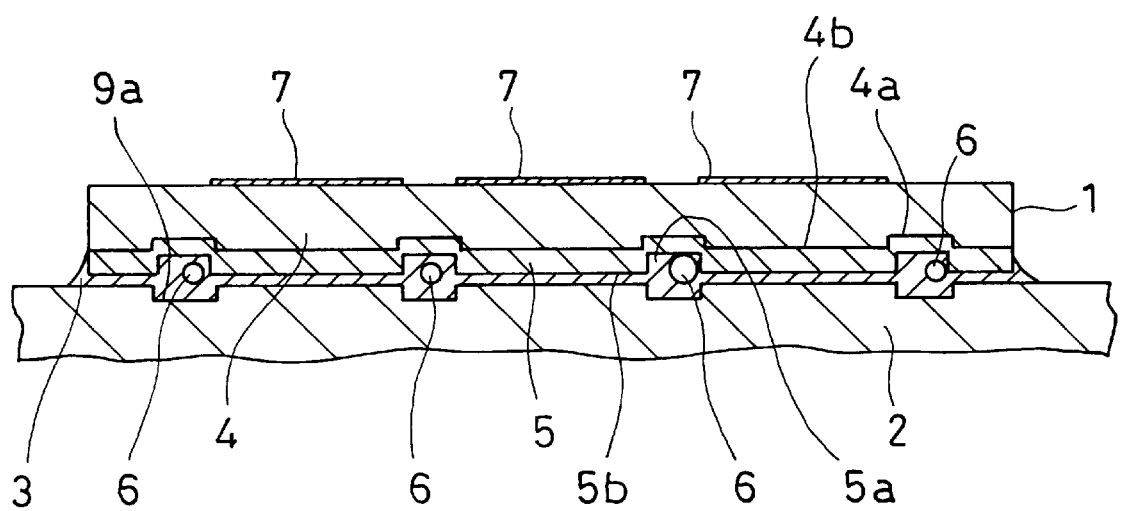
FIG. 3 is a cross-sectional view which shows the third embodiment of the present invention.
Figure 4A:
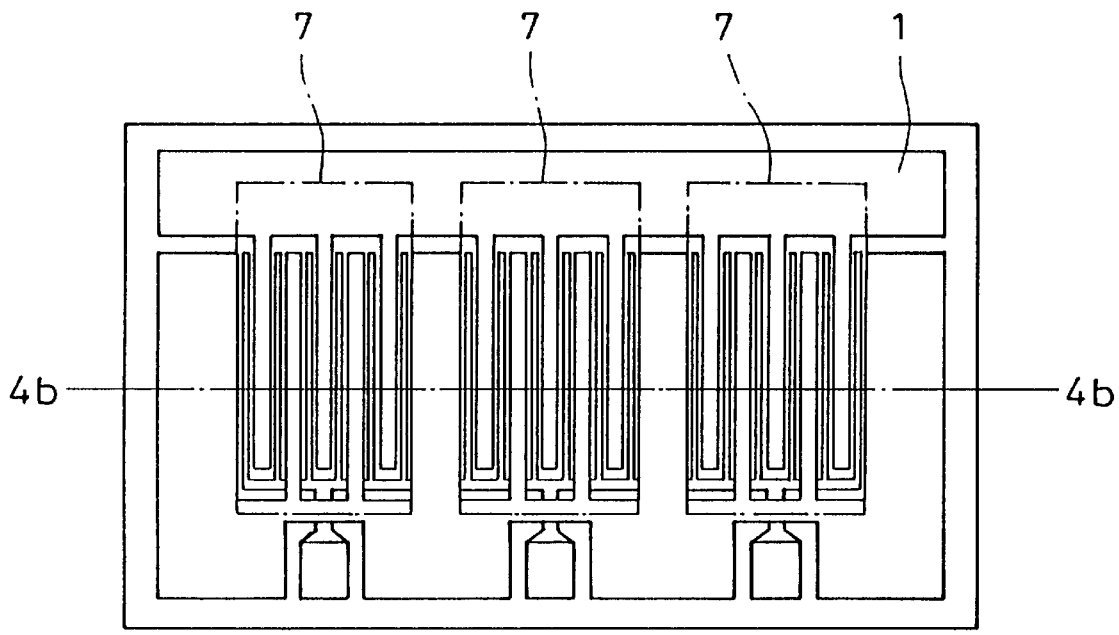
FIG. 4(*a*) is a plan view of prior art, and FIG. 4(*b*) is a cross-sectional view thereof, along line C—C shown in FIG. 4(*a*).
Figure 4B:
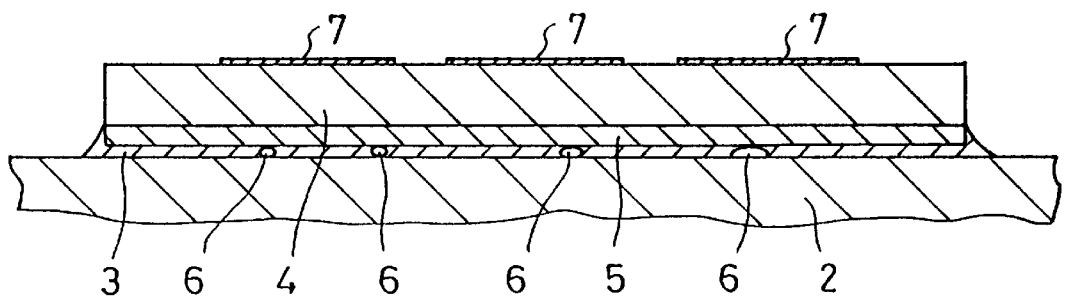

Embodiments of present invention are described below, with reference being made to the relevant accompanying drawings.

The first embodiment of the present invention is shown in FIG. 1, FIG. 1(*a*) being a plan view thereof, and FIG. 1(*b*) being a cross-sectional view thereof, along the line A—A which is shown in FIG. 1(*a*).

In FIG. 1, the GaAs-substrate 4 of the GaAs FET chip 1 is made to be 35 μm thick, in order to reduce the thermal resistance thereof, this GaAs substrate 4 having formed on it as one a GaAs power FET, heat being generated in the region in which this GaAs power FET is formed, this becoming the heat-generating region 7.

In the first embodiment of the present invention, a concave portion 4a is provided on the rear surface of the GaAs substrate 4, at a location that is on the other side from the heat-generating region 7.

The concave portion 4a is provided in a region that avoids the heat-generating region 7 of the substrate 4, but that is in a region that is neighboring to the heat-generating region 7. The concave portion 4a is formed so as to be stripe-shaped by dry etching the rear surface of the substrate 4, this being formed in the shape of a groove having a depth of 5 μm and a width of 5 μm.

Additionally, neighboring the concave portion 4a on the rear surface of the substrate opposite the heat-generating region 7, there is a protruding part 4b, this being in the form of a protruding flat surface outward with respect to the concave portion 4a.

Additionally, to strengthen the GaAs substrate 4, gold plating 5 is applied to the rear surface of the substrate 4. This gold plating 5 is laid on in a concave/protruding shape so as to follow the shapes of the concave portion 4a and the protruding part 4b of the rear surface of the substrate 4. Therefore, in the region of the protruding part 4b of the substrate 4, the gold plating 5 protrudes out downward as a flat surface, and in the region of the concave portion 4a, the gold plating 5 recedes into the depressed part, resulting in a construction provided with a void-collection section 5a having a depressed shaped gold plating 5 laid onto the concave portion 4a.

In the first embodiment of the present invention, the GaAs FET chip 1 is die-bonded to a copper package 2 using an AuSn row material 3 as scribing is done. At this point, the package 2 is heated to 320° C.

Because the surface area of the rear surface of the substrate 4 of the GaAs FET chip 1 is large, when attaching row material 3 to the GaAs FET chip 1, there is a tendency for voids 6 to occur within the AuSn row material 3.

In the first embodiment of the present invention, when pressing the GaAs FET chip 1 onto the package 2, because of the protruding part 4b which protrudes downward in correspondence to the heat-generating region 7 of the substrate 4, voids 6 which are includes in the AuSn row material 3 that is disposed between the protruding part 4b and the package 2 are pushed to the left and to the right, so that they move to the side of the void-collection section 5, resulting in the void 6 being removed from within the AuSn row material 3 between the protruding part 4b and the package 2.

A void 6 that is removed from within the AuSn row material 3 by the pressing force of the protruding part 4b is pushed outward from the region of the GaAs FET chip 1, or is captured by a neighboring void-collecting section 5a.

Therefore, a void 6 is removed from a region which corresponds in opposition to a heat-generating region of the substrate 4, and is capture in a void-collection section 5a that is provided at a position that avoids a heat-generating region 7, so that even if the heat-generating region 7 generates heat when the chip 1 operates, no void exists in that heat-generating region 7, so that there is no locally high temperature in the chip 1 caused by the existence of the void 6.

Because the void-collection section 5a which has captured a void 6 is provides so as to avoid a location at a heat-generating region 7, even if it captures a void, there is no locally high temperature in the chip 1 caused by the existence of the void 6.

By virtue of the above action, it is possible to adjust the surface temperature of the GaAs FET chip 1 so as to be approximately uniform.

In a semiconductor device of the past, such as power GaAs FET having a DC bias power in the class of 40 watts, in the case in which voids 6 exist in the AuSn row material 3, the chip temperature immediately above that part rises to approximately 10° C. higher than other parts of the chip.

In contrast to the above, in a semiconductor device according to the first embodiment of the present invention, voids are pushed from the heat-generating region 7 of the chip 1 to a non-heat-generating region thereof, so that a void 6 does not exist immediately above the heat-generating region 7, the result being that there is suppression of the approximate 10° C. rise in temperature at the chip surface at the heat-generating region 7, this enabling a reduction of the chip surface temperature of 10° C. with respect to the past.

In the first embodiment of the present invention, therefore, in the heat-generating region of the chip 1 the heat is dispersed uniformly, without a local high-temperature part, it is possible to prevent a deterioration of characteristics and a decrease in resistance to damage, and it is further possible to obtain a long lifetime.

FIG. 2 shows the second embodiment of the present invention, with FIG. 2(a) showing a plan view thereof, and FIG. 2(b) showing a cross-sectional view along the line B—B which is shown in FIG. 2(a).

Whereas in the first embodiment the void-collecting section 5a was provided in the column direction (up-down direction in the drawing) of the chip 1 along the heat-generating region 7, in the second embodiment this is provided in the row direction (left-right direction in the drawing) of the chip 1.

The concave portion 4a is provided in a region that avoids the heat-generating region 7 of the substrate 4, but that is in a region that is neighboring to the heat-generating region 7. The concave portion 4a is formed so as to be stripe-shaped by dry etching the rear surface of the substrate 4, this being formed in the shape of a groove having a depth of 5 μm and a width of 5 μm.

Additionally, neighboring the concave portion 4a on the rear surface of the substrate opposite the heat-generating region 7, there is a protruding part 4b, this being in the form of a protruding flat surface outward with respect to the concave portion 4a.

In this second embodiment as well, a void 6 is removed from the heat-generating region 7 of the chip 1, and is captured by a void-collection section 5a which is provided in a location that avoids the heat-generating region 7 and that is neighboring thereto, so that the same effect is achieved as with the first embodiment.

FIG. 3 shows the third embodiment of the present invention, which shows a cross sectional view thereof.

The concave portion 4a is formed on the rear surface of said semiconductor chip 1 opposite to the package 2, and the concave portion 9a is formed on the surface of package 2 opposite to said semiconductor chip 1.

In this third embodiment as well, a void 6 is removed from the heat-generating region 7 of the chip 1, and is captured by a void-collection section 5a which is provided in a location that avoids the heat-generating region 7 and that is neighboring thereto, so that the same effect is achieved as with the first embodiment.

Although in each of the embodiments described above the cross-section shape of the void-collecting section 5a is rectangular, this is not a limit that is imposed with regard to shape, and it is possible to have any shape as long as it is a shape that captures a void 6.

Additionally, although the void-collection section 5a was in the shape of a stripe, any shape can be used as long as it is provided in a location that avoids the heat-generating region 7.

As described above, a semiconductor device of the present invention is a semiconductor device comprising a package on which a semiconductor chip including a semiconductor substrate provided with operation circuits, is mounted, wherein said semiconductor chip is connected to said package via adhesive material attached to a back surface of said semiconductor chip, and further wherein at least one void collection section is provided at least on one of surfaces selected from a surface of said semiconductor chip opposite to said package and a surface of said package opposite to said semiconductor chip, and said void collection section comprising a concave portion and being provided at an area which avoids a heat-generating region on the contacting surface of said semiconductor chip, and when said semiconductor chip is contacted to said package with a pressure, said void collection section capturing voids that are removed from said adhesive material between said package and said chip located and existing in said heat-generating region on the contacting surface of said semiconductor chip.

According to the present invention, having a constitution as described in detail above, a void that occurs between the chip and the package is pushed to a location that avoids the heat-generating region of the chip, making it possible to prevent a local high temperature caused by the existence of a void at the heat-generating region, this preventing a decrease in resistance with respect to deterioration of characters and damage, and enabling the achievement of a long life.

Additionally, because there is no void at the heat-generating region of the chip, it is possible to improve the intimate contact between the chip and the package, thereby improving the effectiveness of release of heat therefrom.

What is claimed is:

1. A semiconductor device comprising a package on which a semiconductor chip including a semiconductor substrate provided with operation circuits, is mounted, wherein said semiconductor chip is connected to said package via adhesive material attached to a first surface of said semiconductor chip and further wherein at least one void collection section is provided on at least one of surface selected from a surface of said semiconductor chip opposite to said package, a heat generating region is provided on a second surface of said chip, said void collection section providing a capturing area comprising a concave portion provided in said first surface at an area which avoids said heat generating region, said void collection section capturing voids that are ejected from said adhesive material existing between said package and said chip when said chip is contacted to said package with a pressure.

2. A semiconductor device according to claim 1, wherein among said void collection sections, at least one protruding part is formed at an area opposite to said heat-generating region of said chip, said protruding part having a flat surface, and said protruding surface acting to narrow a space formed between said package and said chip so as to push away voids held in said space corresponding to said heat-generating region to outside said area.

3. A semiconductor device according to claim 1, wherein said void collection section is provided at a location which avoids said heat-generating region of said chip but which also is neighboring to said heat-generating region.

4. A semiconductor device according to claim 1, wherein said concave portion is formed on a surface of said semiconductor chip opposite to said package.

5. A semiconductor device according to claim 1, wherein said concave portion is formed on a surface of said package opposite to said semiconductor chip.

6. A semiconductor device according to claim 1, wherein said concave portion is formed on both surfaces of said semiconductor chip opposite to said package and of said package opposite to said semiconductor chip.

* * * * *